United States Patent
Warlick et al.

(10) Patent No.: US 9,775,260 B1
(45) Date of Patent: Sep. 26, 2017

(54) BRACKETS FOR USE WITH THREE RACK MOUNT SYSTEMS

(71) Applicant: Overture Networks, Inc., Morrisville, NC (US)

(72) Inventors: Charles Philip Warlick, Cary, NC (US); Gregory William Goodchild, Cary, NC (US)

(73) Assignee: ADVA OPTICAL NETWORKING SE, Meiningen-Dreißigacker (DE)

( * ) Notice: Subject to any disclaimer, the term of this patent is extended or adjusted under 35 U.S.C. 154(b) by 65 days.

(21) Appl. No.: 14/666,027

(22) Filed: Mar. 23, 2015

(51) Int. Cl.
| | |
|---|---|
| F16M 13/02 | (2006.01) |
| A47B 96/06 | (2006.01) |
| F16L 3/14 | (2006.01) |
| F16L 3/24 | (2006.01) |
| H05K 7/14 | (2006.01) |
| E05D 15/24 | (2006.01) |
| A47B 81/06 | (2006.01) |

(52) U.S. Cl.
CPC .............. *H05K 7/14* (2013.01); *F16M 13/02* (2013.01); *A47B 81/06* (2013.01); *A47B 96/06* (2013.01); *E05D 15/24* (2013.01)

(58) Field of Classification Search
CPC ........... A47B 96/06; A47B 81/06; G09F 7/18; F16M 13/02; H05K 7/14
USPC .. 248/235, 300, 558, 221.12, 224.8, 223.21, 248/225.11, 247, 250, 534; 211/90.01
See application file for complete search history.

(56) References Cited

U.S. PATENT DOCUMENTS

| | | | | |
|---|---|---|---|---|
| 5,897,086 | A * | 4/1999 | Condon | .................... F24H 9/06 |
| | | | | 248/300 |
| 6,131,361 | A * | 10/2000 | Murphy | ................ E04F 21/185 |
| | | | | 248/221.12 |
| 6,269,959 | B1 | 8/2001 | Haworth | |
| 6,462,961 | B1 * | 10/2002 | Johnson | ................. A47B 81/06 |
| | | | | 211/26 |
| 6,554,142 | B2 | 4/2003 | Gray | |
| 6,597,576 | B1 | 7/2003 | Smith | |
| 6,669,156 | B2 * | 12/2003 | East | ........................ E05D 15/24 |
| | | | | 248/300 |
| 7,429,023 | B2 | 9/2008 | Morrow | |
| 7,857,145 | B2 | 12/2010 | Mushan | |
| 7,934,607 | B2 | 5/2011 | Henderson | |
| 8,040,693 | B2 | 10/2011 | Blomquist | |
| 8,146,756 | B2 | 4/2012 | Brock | |
| 8,596,471 | B2 | 12/2013 | Chen | |
| 8,770,528 | B2 | 7/2014 | Chen | |
| 8,857,925 | B2 | 10/2014 | Liu | |

(Continued)

OTHER PUBLICATIONS

Overture 1400 User Guide, Release 13.1—Mar. 2014—Part No. 999605-003-0000-13.1, Rev 01, Mar. 10, 2014, (Cover page, title page, first page of table of contents, and pp. 2-6 to 2-8), Overture Networks, Inc. Morrisville, North Carolina.

*Primary Examiner* — Tan Le
(74) *Attorney, Agent, or Firm* — Kevin E Flynn; Flynn IP Law

(57) ABSTRACT

A pair of brackets to allow a component with a chassis of width W to be installed in one of three standardized racks, a wide gap rack, a narrow gap rack, or an intermediate gap rack. Each bracket having a corner between a short leg and a long leg, longer than the short leg. The brackets may also be used to mount the component to a wall instead of installed in a standardized rack.

10 Claims, 11 Drawing Sheets

(56) References Cited

U.S. PATENT DOCUMENTS 8,870,135 B2 * 10/2014 Grubbs .................... F16L 3/14
                                                                         248/200
8,870,163 B2    10/2014 Regan
9,228,693 B2 *  1/2016 Ditges .................... F16M 11/10

* cited by examiner

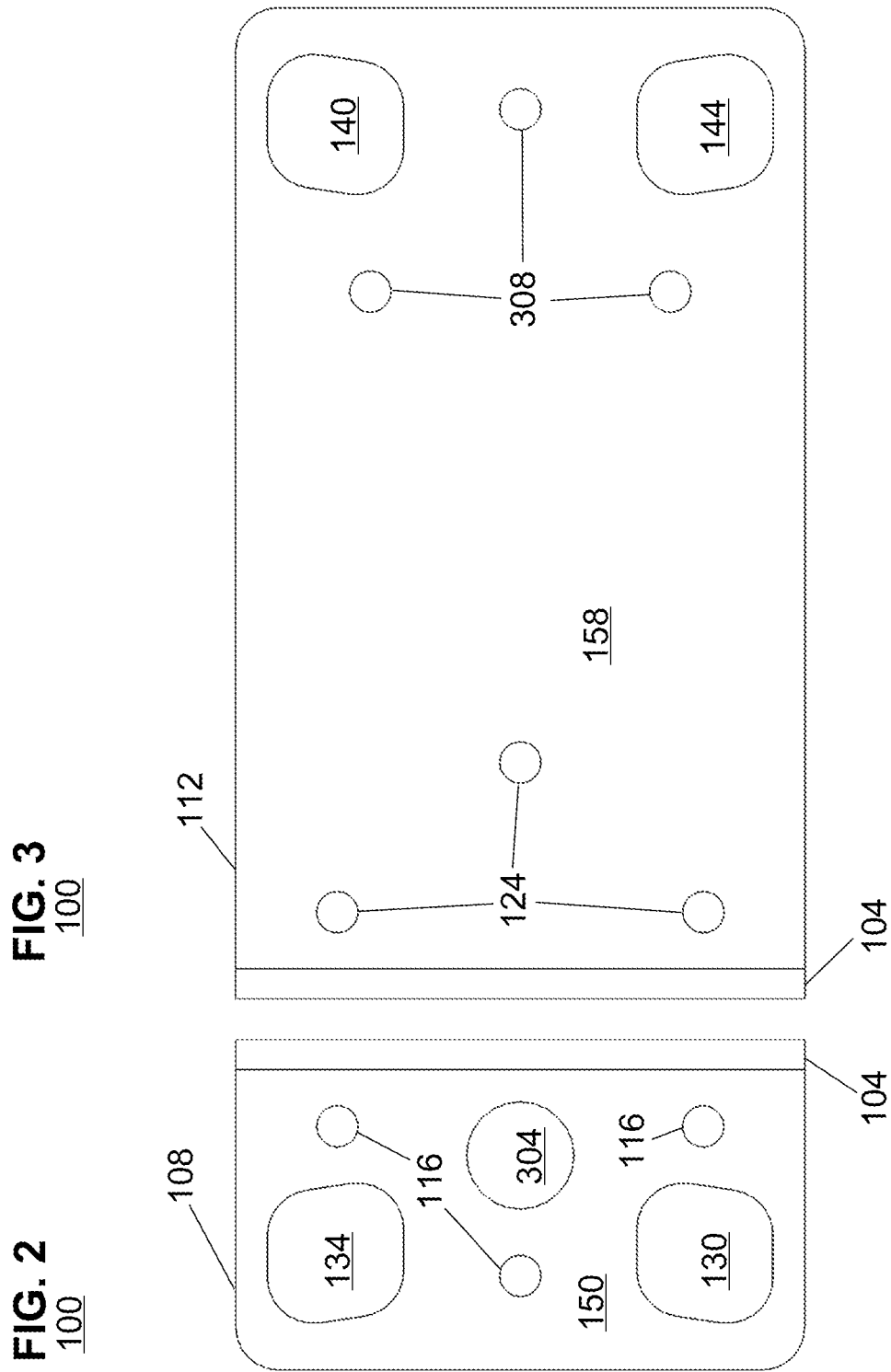

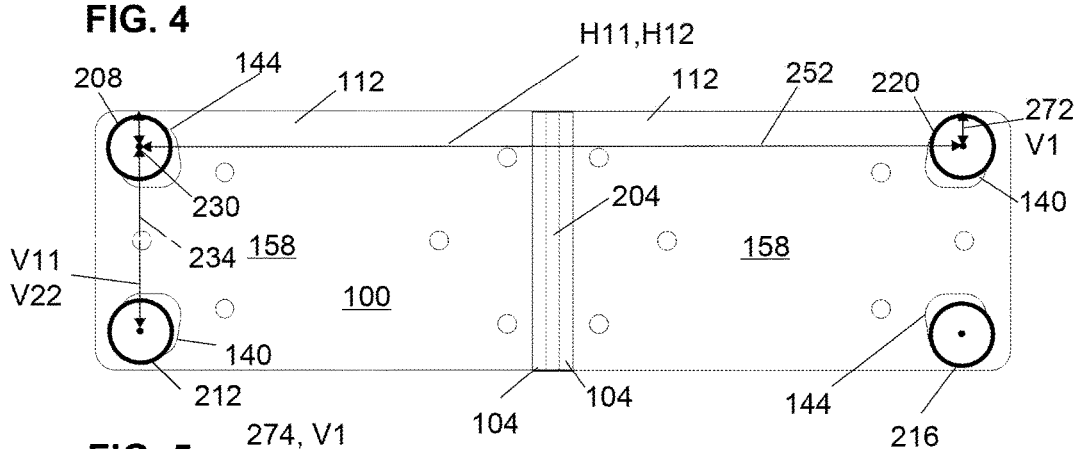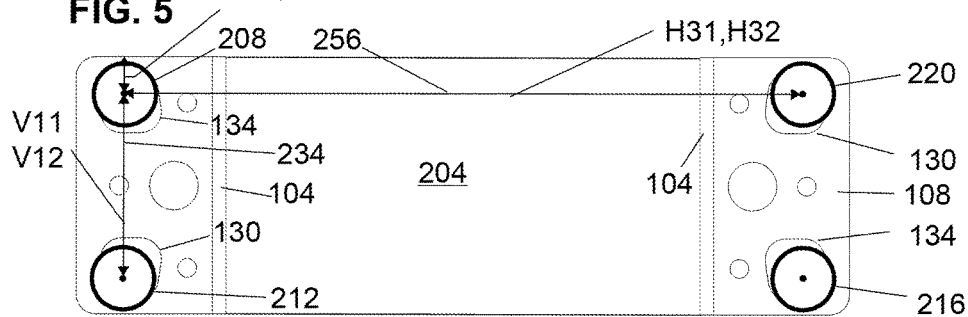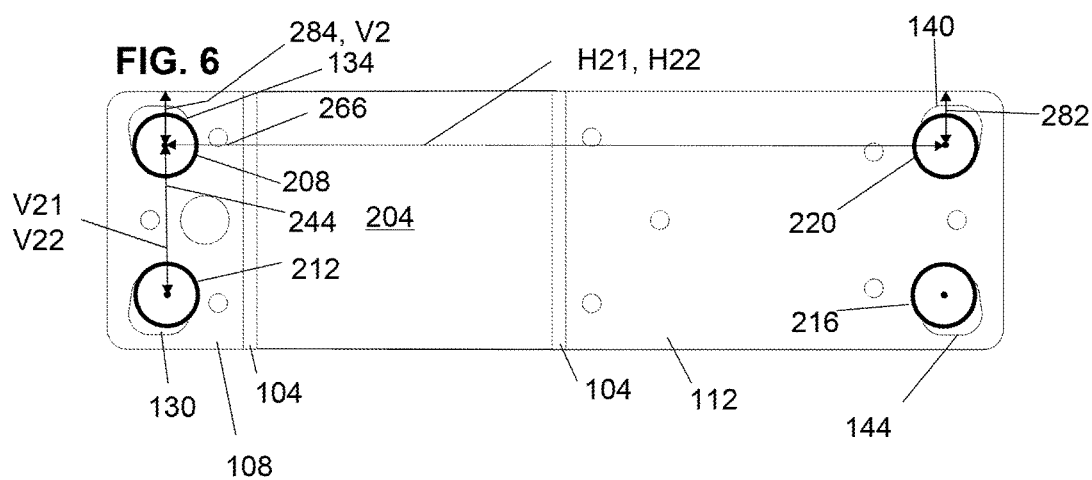

| 1010 | Determine whether the standardized rack has the wide gap, narrow gap, or intermediate gap. | | | | |
|---|---|---|---|---|---|
| If wide gap then... | | If narrow gap then... | | If intermediate gap then... | |
| 1100 | Affix both short legs to chassis. | 1200 | Affix both long legs to chassis | 1300 | Affix a short leg of one bracket to the chassis. |
| 1110 | Align long leg openings with bores in mounting flanges. | 1210 | Align short leg openings with bores in mounting flanges. | 1310 | Affix a long leg of another bracket to the chassis. |
| 1120 | Fasten brackets to mounting flanges. | 1220 | Fasten brackets to mounting flanges. | 1320 | Align set of short leg openings with set of bores in one mounting flange. |
| 1125 | End. | 1225 | End. | 1330 | Fasten short leg to mounting flange. |
| | | | | 1340 | Align set of long leg openings with set of bores in other mounting flange. |
| | | | | 1350 | Fasten long leg to other mounting flange. |
| | | | | 1355 | End. |

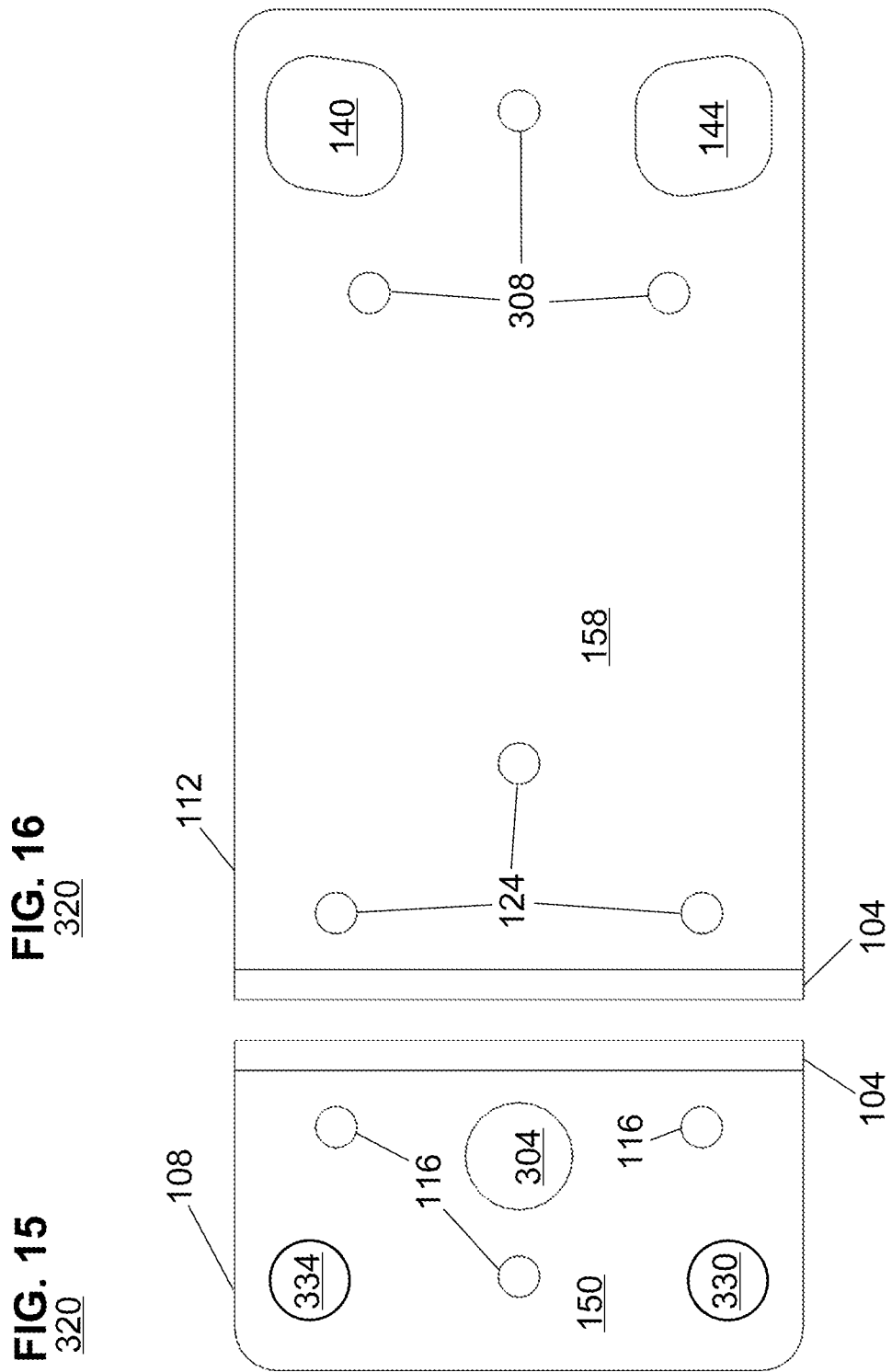

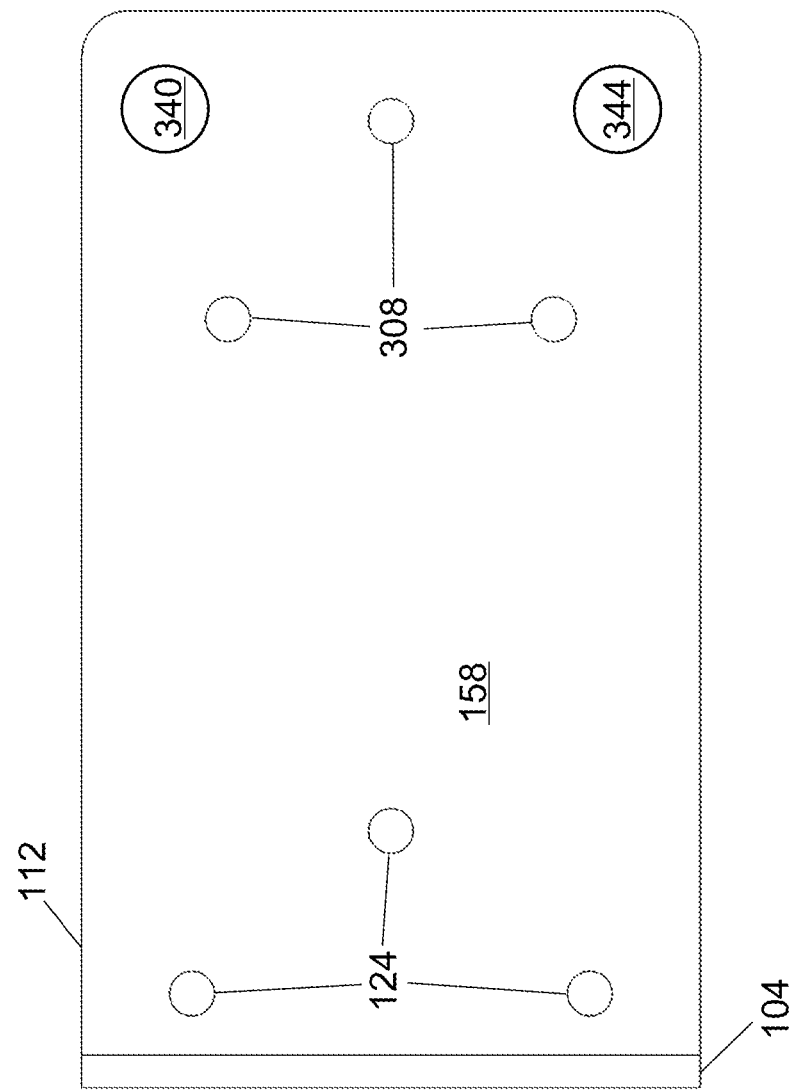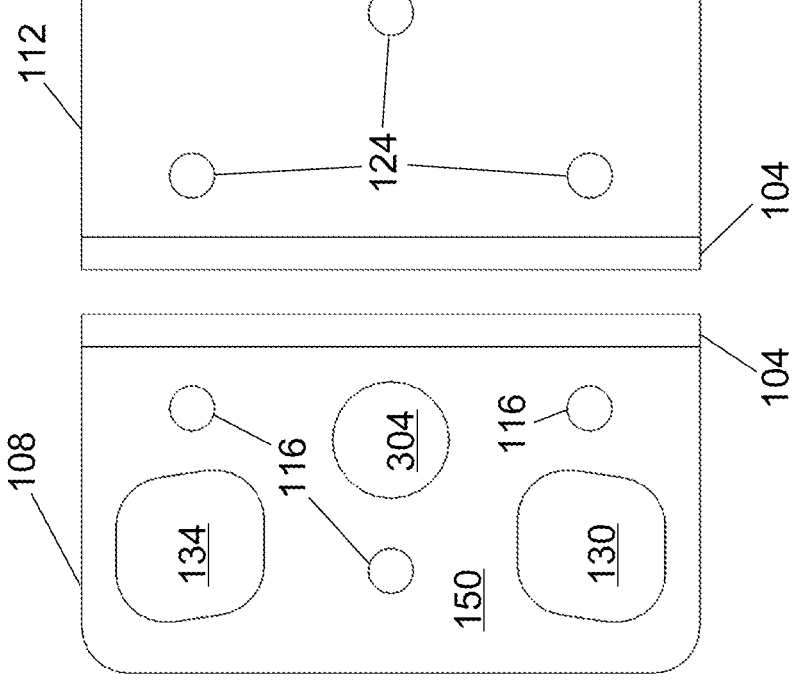

360

BRACKETS FOR USE WITH THREE RACK MOUNT SYSTEMS

BACKGROUND

Field of the Disclosure

This disclosure relates generally to brackets or mounting assemblies for industry standard rack mount systems as well to mounting on flat surfaces or walls. In particular this disclosure relates to brackets that may be used with three different standard rack mount systems having different rack mount geometries.

Brackets are designed to mount a given chassis to various rack mount geometries in use in telecommunication or data centers. Typically a bracket set is designed for specific rack mount geometries, although bracket pairs have been created which can be used with a pair of standard rack mount geometries such as the North American Telco 23 inch rack and the EIA-310 19 inch rack. As such, multiple bracket designs are typically designed for a given chassis depending on the rack mount geometries in use in a given geography or environment.

In many circumstances when discussing an electronic component, the focus is typically on the component and the electronics within such as circuit boards, power supplies, fans, or other components. For purposes of the present disclosure, the focus will be on the portion of the component that contains and supports the electronics within the component. This framework is frequently called a chassis. The interaction of a bracket to mount a component is actually with the chassis as the chassis is adapted to receive fasteners to affix the bracket to the component chassis.

SUMMARY OF THE DISCLOSURE

The present disclosure provides for pairs of brackets that implement a mounting solution to allow one pair of brackets to be used with three different predominantly employed rack mount geometries in three different rack mount systems. Optionally, the bracket pairs can be made so as to support wall mounting of a component instead of rack mounting. The brackets may be interchangeable or the brackets may be specialized so that the individual brackets have specific roles when used with a particular rack mount geometry.

Aspects of the teachings contained within this disclosure are addressed in the claims submitted with this application upon filing. Rather than adding redundant restatements of the contents of the claims, these claims should be considered incorporated by reference into this summary.

This summary is meant to provide an introduction to the concepts that are disclosed within the specification without being an exhaustive list of the many teachings and variations upon those teachings that are provided in the extended discussion within this disclosure. Thus, the contents of this summary should not be used to limit the scope of the claims that follow.

Inventive concepts are illustrated in a series of examples, some examples showing more than one inventive concept. Individual inventive concepts can be implemented without implementing all details provided in a particular example. It is not necessary to provide examples of every possible combination of the inventive concepts provide below as one of skill in the art will recognize that inventive concepts illustrated in various examples can be combined together in order to address a specific application.

Other systems, methods, features and advantages of the disclosed teachings will be or will become apparent to one with skill in the art upon examination of the following figures and detailed description. It is intended that all such additional systems, methods, features and advantages be included within the scope of and be protected by the accompanying claims.

BRIEF DESCRIPTION OF THE FIGURES

The disclosure can be better understood with reference to the following figures. The components in the figures are not necessarily to scale, emphasis instead being placed upon illustrating the principles of the disclosure. Moreover, in the figures, like reference numerals designate corresponding parts throughout the different views.

FIG. 2 is a rear view of the bracket with the short leg visible.

FIG. 3 is a rear view of the bracket with the long leg visible.

FIG. 4 illustrates a pair of brackets connected to component chassis 204 to connect to mounting flanges for a wide-gap rack.

FIG. 5 illustrates a pair of brackets connected to component chassis 204 to connect to mounting flanges for a narrow-gap rack.

FIG. 6 illustrates a pair of brackets connected to component chassis 204 to connect to mounting flanges for an intermediate-gap rack.

FIG. 14 sets forth process 1000 is a process to allow a chassis of width W to be installed in one of three standardized racks using a pair of brackets.

FIG. 15 shows the short leg 108 of specialized bracket 320.

FIG. 16 shows the long leg 112 of the specialized bracket 320.

FIG. 17 shows the short leg 108 of specialized bracket 324.

FIG. 18 shows the long leg 112 of specialized bracket 324.

DETAILED DESCRIPTION

Figure 1:
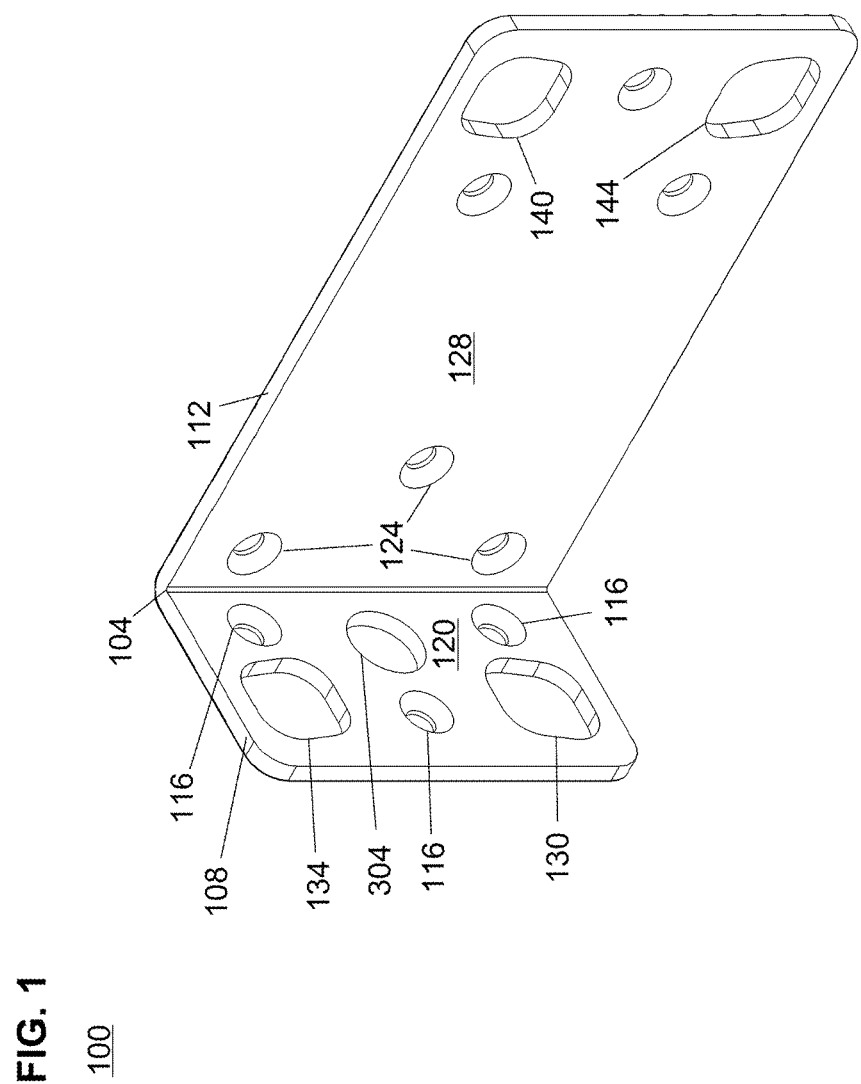
FIG. 1 is a perspective view of a bracket showing the front sides of the long leg and short leg of the bracket.

FIG. 1 shows bracket 100 with corner 104 joining short leg 108 to long leg 112 to form an L-shaped bracket.

The bracket 100 includes a set of short-leg-chassis-holes 116, in this example there are three short-leg-chassis-holes 116. The three short-leg-chassis-holes 116 have a recess on the front, non-chassis side 120 of the bracket 100 to at least partially receive a fastener head. The short-leg-chassis-holes 116 may be used with fasteners (not shown) to connect the bracket 100 to a component chassis with a corresponding set of threaded bores. As the patterns of threaded bores on the component chassis are not specified by a standard, the manufacturer of the component and brackets for the component may choose other patterns than what is shown here. The number of connections may be one or more short-leg-chassis-holes.

The bracket 100 includes a set of long-leg-chassis-holes 124, in this example there are three long-leg-chassis-holes 124. The three long-leg-chassis-holes 124 have a recess on the front, non-chassis side 128 of the bracket 100 to at least partially receive a fastener head. The long-leg-chassis-holes 124 may be used with fasteners (not shown) to connect the bracket 100 to a component chassis with a corresponding set of threaded bores. As the patterns of threaded bores on the component chassis are not specified by a standard, the manufacturer of the component and brackets for the component may choose other patterns than what is shown here. The number of connections may be one or more long-leg-chassis-holes. The pattern of long-leg-chassis-holes may match the patter of short-leg-chassis-holes in order to engage a common set of bore holes in the chassis.

The bracket 100 includes a pair of short-leg-rack-mount-openings 130 and 134. The bracket includes a pair of long-leg-rack-mount-openings 140 and 144. As described in more detail below, these openings (130, 134, 140, and 144) are substantially larger than the major diameters of threaded fasteners used to connect the bracket 100 to mounting flanges for the component rack to receive the component attached to the pair of brackets 100.

FIG. 2 shows the short-leg-chassis-side 150 including corner 104, short-leg-chassis-holes 116, and short-leg-rack-mount-openings 130 and 134. As discussed in more detail below, for a particular use only the short-leg-chassis-side 150 or the long-leg-chassis-side 158 is placed adjacent to the chassis 204.

FIG. 3 shows the long-leg-chassis-side 158 including corner 104, long-leg-chassis-holes 124 and long-leg-rack-mount-openings 140 and 144.

FIG. 4 shows a component chassis 204 with a pair of brackets 100 arranged to have the short legs (not visible in FIG. 4) placed against the chassis 204. As the focus of this this application is on the brackets, the chassis is shown in FIG. 4, FIG. 5, and FIG. 6 as a small space between the brackets 100. In actual practice, the chassis 204 is apt to be substantially wider than the long leg 112 of the bracket. Further, the chassis 204 remains of constant width and the use of the pair of brackets 100 in different orientations allows the fixed width chassis 204 to fit within standardized frames of three different widths.

FIG. 4 shows the long-leg-chassis-sides 158 of the two brackets 100 facing outward.

Outer perimeters of upper left fastener 208, lower left fastener 212, lower right fastener 216 and upper right fastener 220 are shown. Each is aligned with a centerline 230 of a bore in the mounting flange. The fasteners (208, 212, 216, and 220) may have a driver engagement section suitable for transferring torque from a tool to the fastener to cause the threaded fastener to engaged threads bores within the flange mounts of the standardized racks (not shown). Alternatively, the bores in the mounting flanges may be unthreaded and the threaded fastener may engage a cap nut or other threaded component. A Phillips head screwdriver may be used to engage a corresponding opening in the heads of the fasteners (208, 212, 216, and 220). When the pair of brackets 100 are attached to the chassis 204 to leave the long legs 112 extending laterally, the long-leg-rack-mount-openings (140 and 144) may be positioned to expose four bores in the flange mount to allow engagement with the four fasteners (208, 212, 216, and 220).

For an appropriately sized chassis 204 and brackets 100, FIG. 4 may show a chassis 204 with brackets 100 suitable for mounting in a North American Telco 23 Inch Rack.

FIG. 5 shows a component chassis 204 with a pair of brackets 100 arranged to have the long legs (not visible in FIG. 5) placed against the chassis 204. As noted above, while the chassis has been made of differing widths in FIG. 4, FIG. 5, and FIG. 6 in order to devote much space to the brackets 100, the width of chassis 204 is constant and the use of the pair of brackets 100 in different orientations allows the fixed width chassis 204 to fit within standardized frames of three different widths.

FIG. 5 shows the chassis sides 150 of the short legs 108 of the two brackets 100 facing outward.

Outer perimeters of upper left fastener 208, lower left fastener 212, lower right fastener 216 and upper right fastener 220 are shown. The fasteners (208, 212, 216, and 220) may have a driver engagement section suitable for transferring torque from a tool to the fastener to cause the threaded fastener to engaged threads bores within the flange mounts of the standardized racks (not shown) or to engage a cap nut or other threaded component. A Phillips head screwdriver may be used to engage a corresponding opening in the heads of the fasteners (208, 212, 216, and 220). When the pair of brackets 100 are attached to the chassis 204 to leave the short legs 108 extending laterally, the short-leg-rack-mount-openings (130 and 134) may be positioned to expose four bores in the flange mount to allow engagement with the four fasteners (208, 212, 216, and 220).

For an appropriately sized chassis 204 and brackets 100, FIG. 5 may show a chassis 204 with brackets 100 suitable for mounting in an EIA-310 19 Inch Rack. EIA is an initialism for the Electronic Industries Alliance. The spacing of bores on the flange mounts are the same for the EIA-310 19 Inch Rack and the North American Telco 23 Inch Rack so having brackets that can be used in these two racks is predominantly a question of sizing the long leg and short legs appropriately for a given chassis width.

FIG. 6 may be used to place the chassis 204 into a rack that is not as wide as accommodated with both brackets 100 extending long legs 112 outward, but wider than the rack accommodated with both brackets 100 extending short legs 108 outward. In FIG. 6, one bracket 100 is connected to the chassis 204 using the long-leg-chassis-holes to leave the short leg 108 extended and the other bracket 100 is connected using the short-leg-chassis-holes to leave the long leg 112 extended. This leaves one pair of short-leg-rack-mount-openings (130 and 134) and one pair of long-leg-rack-mount-openings (140 and 144) to use with fasteners to engage the brackets 100 to the right mounting flange and the left mounting flange. One of skill in the art will recognize that the short leg 108 could be placed to either the left side (as shown in FIG. 6) or the right side of chassis 204 as long as the other side had bracket 100 connected with the long leg 112 extending outward.

A careful observer will note that the vertical distance between centerlines 230 of the bores between the upper left fastener 208 and lower left fastener 212 is distance 234 for both FIG. 4 and FIG. 5 but the distance between centerlines 230 of the bores of the upper left fastener 208 and the lower left fastener 212 in FIG. 6 is distance 244 which is shorter than distance 234 although the brackets 100 are all the same size. As there are allowable deviations to allow for manufacturing tolerances under the standards, distance 234 between centerlines 230 may be said to fall within a range of distances between distance V11 and distance V12. Distance 244 between centerlines 230 may be said to fall within range of distances V21 to V22 where the average of distances V11 and V12 is not equal to the average of distances V21 and V22.

In FIG. 4, the horizontal distance between the centerline 230 of the bore receiving the upper left fastener 208 and the centerline 230 of the bore receiving the upper right fastener 200 is distance 252. To account for manufacturing tolerances, there is a horizontal range of a distance between H11 and H12 for distance 252.

In FIG. 5, the horizontal distance between the centerline 230 of the bore receiving the upper left fastener 208 and the centerline 230 of the bore receiving the upper right fastener 200 is distance 256. To account for manufacturing tolerances, there is a horizontal range of a distance between H31 and H32 for distance 256.

In FIG. 6, the horizontal distance between the centerline 230 of the bore receiving the upper left fastener 208 and the centerline 230 of the bore receiving the upper right fastener 200 is distance 266. To account for manufacturing tolerances, there is a horizontal range of a distance between H21 and H22 for distance 266.

While not shown to scale in FIG. 4, FIG. 5, and FIG. 6, the width of component chassis 204 is uniformly a fixed distance W. The average of distances H11 and H12 is more than the average of distances H21 and H22 which is more than the average of distances H31 and H32.

Due in part to the difference in vertical spacing (distance 234 versus distance 244), the portions of the perimeters of the long-leg-rack-mount-openings (140 and 144) retained by the fastener heads for fasteners (216 and 220) in FIG. 4 for the wide-gap rack is different from the portions of the perimeters of the long-leg-rack-mount-openings (140 and 144) retained by the fastener heads of fasteners (216 and 220) in FIG. 6 for the intermediate-gap rack such as an ETSI EN 300-119 rack. Likewise, the portions of the perimeter of short-leg-rack-mount-openings 130 and 134 retained by the upper left fastener 208 and lower left fastener 212 is different in FIG. 6 for the intermediate gap rack compared with FIG. 5 for the narrow gap rack.

Number of Rack Mount Openings.

While the examples shown above have a pair of rack-mount-openings on both the short leg 108 and long leg 112 for engagement with the flange mounts of the standardized racks, the present disclosure does not require specifically two rack-mount-openings. For a component that is taller than shown in the examples above (such as a computer or other larger component), the bracket may have a set of more than two rack-mount-openings. Alternatively, the component may be connected to the rack through use of more than one pair of brackets.

Some components are connected to a rack through a set of four posts (mounting flanges). Thus, the component may be connected a front pair of mounting flanges and also to a rear pair of mounting flanges. In a four-post connection, it may be sufficient to use just one rack-mount opening and one fastener per each of the four flange mounts.

For a bracket 100 with just one short-leg-rack-mount-opening 134, the difference between use in a narrow-gap rack (FIG. 5) and an intermediate-gap rack (FIG. 6) may be noticed in the difference between a distance of the centerline of the bore receiving the fastener 208 and the nearest horizontal edge of the bracket 100. Thus the distance 274 in FIG. 5 is less than distance 284 in FIG. 6 as the location of the bore centerlines relative to the perimeter of short-leg-mount-opening 134 are not the same.

Likewise, for a bracket 100 with just one long-leg-rack-mount-opening 140, the difference between use in a wide-gap rack (FIG. 4) and an intermediate-gap rack (FIG. 6) may be noticed in the difference between a distance of the centerline of the bore receiving the fastener 220 and the nearest horizontal edge of the bracket 100. Thus the distance 272 in FIG. 4 is less than distance 282 in FIG. 6 as the location of the bore centerlines relative to the perimeter of short-leg-mount-opening 140 are not the same.

Clean Views.

Figure 7:
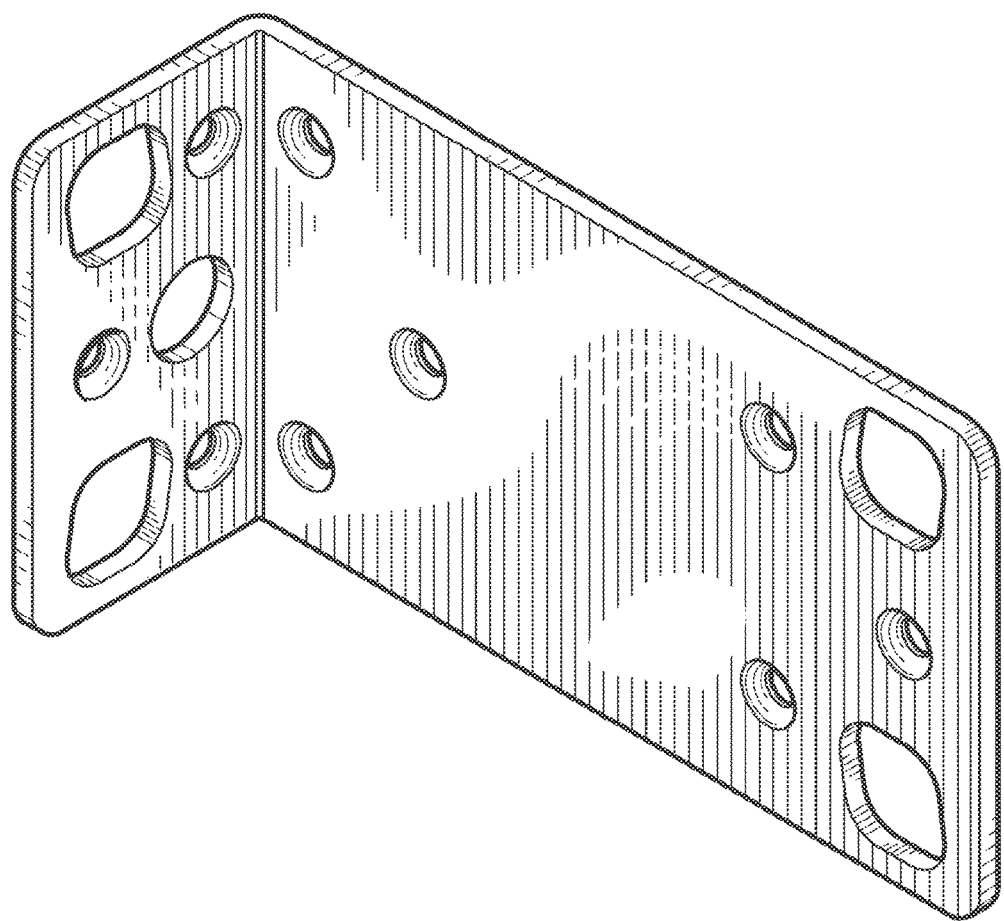
FIG. 7 is a front perspective view of bracket 100.
Figure 8:
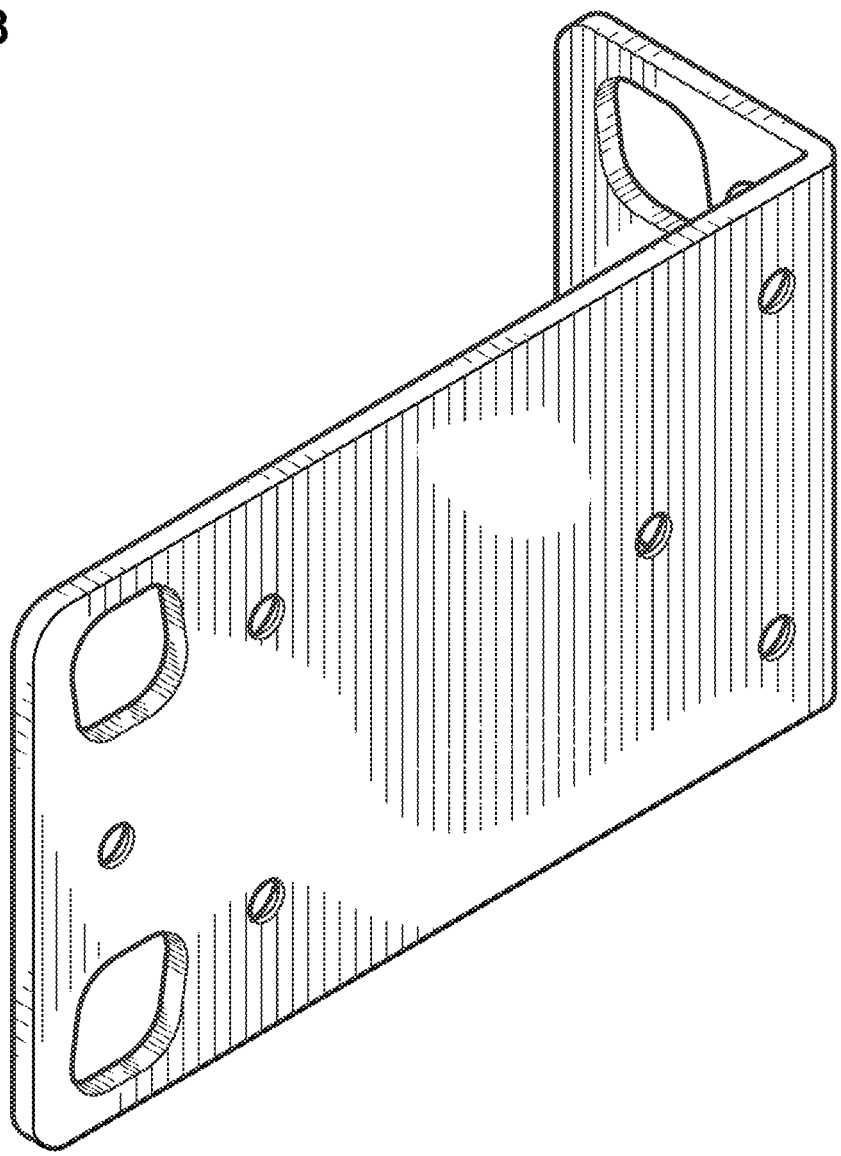
FIG. 8 is a rear perspective view of bracket 100 including the rear of the long leg and a portion of the front of the short leg.
Figure 9:
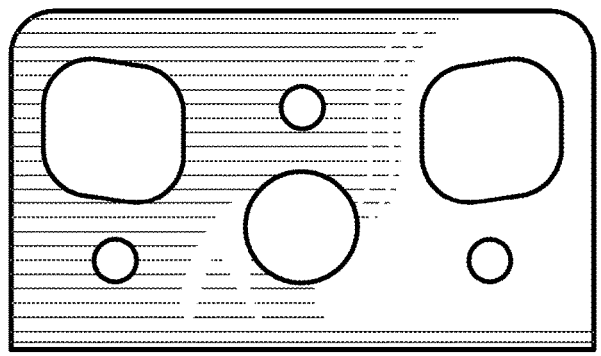
FIG. 9 is a rear view of the short leg of bracket 100.
Figure 10:
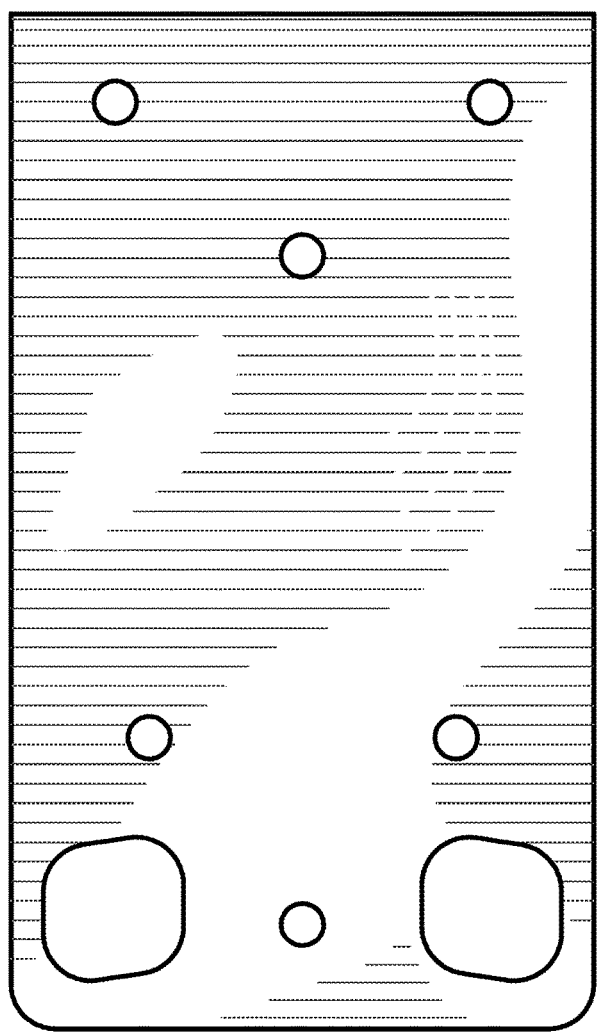
FIG. 10 is a rear view of the long leg of bracket 100.
Figure 11:
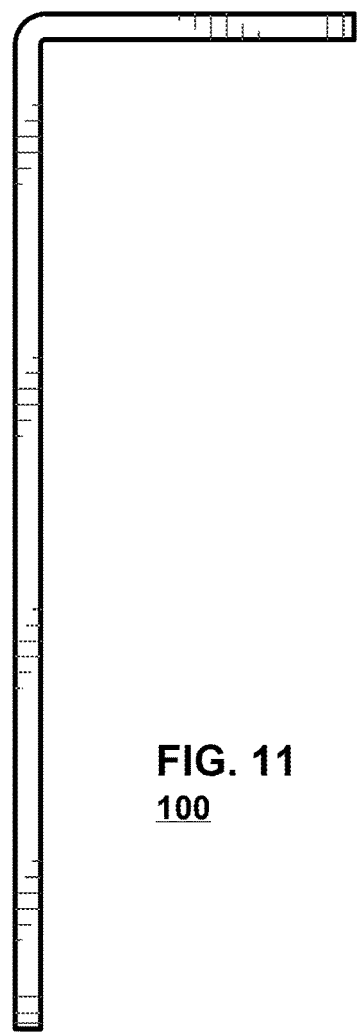
FIG. 11 is a side view of the bracket 100.
Figure 12:
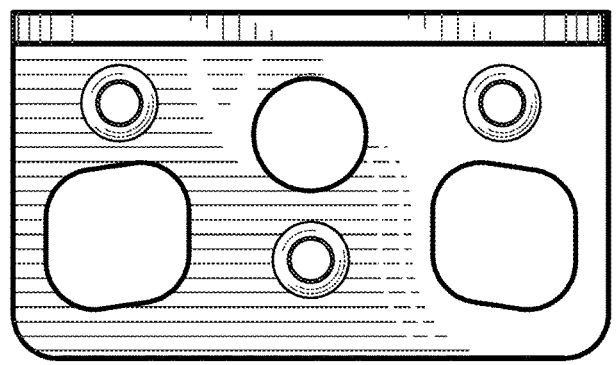
FIG. 12 is a plan view of the front of the short leg of bracket 100 with the long leg extending out of the page.
Figure 13:
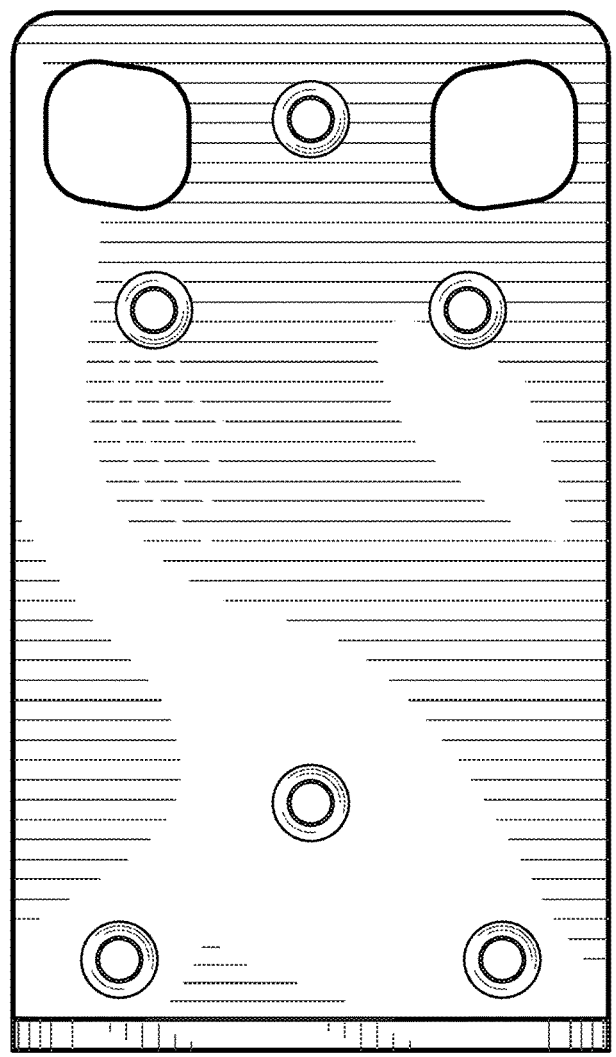
FIG. 13 is a plan view of the front of the long leg of bracket 100 with the short leg extending out of the page.

FIGS. 7-13 provide views of bracket 100 without clutter from element numbers and lead lines. FIG. 7 is a front perspective view of bracket 100. FIG. 8 is a rear perspective view of bracket 100 including the rear of the long leg and a portion of the front of the short leg. FIG. 9 is a rear view of the short leg of bracket 100. FIG. 10 is a rear view of the long leg of bracket 100. FIG. 11 is a side view of the bracket 100. FIG. 12 is a plan view of the front of the short leg of bracket 100 with the long leg extending out of the page. FIG. 13 is a plan view of the front of the long leg of bracket 100 with the short leg extending out of the page.

Method.

FIG. 14 sets forth process 1000 is a process to allow a chassis of width W to be installed in one of three standardized racks using a pair of brackets. Each bracket having a corner between a short leg and a long leg, longer than the short leg. The process steps are:

Step 1010—Determine whether the standardized rack is the rack with the wide gap, the narrow gap, or the intermediate gap. If wide gap then GOTO Step 1100. If narrow gap then GOTO Step 1200. If intermediate gap then GOTO Step 1300.

Step 1100—Affix the short leg of each bracket with fasteners that engage threaded bores in the chassis so that the long legs of each bracket extend laterally outward away from the chassis.

Step 1110—Align a set of at least one long-leg-rack-mount-openings in each bracket over a set of at least one bore in the mounting flange on either side of the rack opening.

Step 1120—Use a threaded engagement to have a set of at least one fastener per bracket hold the bracket against the mounting flange by engaging a first portion of a perimeter of each of the long-leg-rack-mount-openings.

Step 1125—End.

Step 1200—Affix the long leg of each bracket with fasteners that engage threaded bores in the chassis so that the short legs of each bracket extend laterally outward away from the chassis.

Step 1210—Align a set of at least one short-leg-rack-mount-openings in each bracket over a set of at least one bore in the mounting flange on either side of the rack opening.

Step 1220—Use a threaded engagement to have a set of at least one fastener per bracket hold the bracket against the mounting flange by engaging a first portion of a perimeter of each of the short-leg-rack-mount-openings.

Step 1225—End.

Step 1300—Affix the short leg of one bracket with fasteners that engage threaded bores in the chassis so that the long leg of the one bracket extends laterally outward away from the chassis.

Step 1310—Affix the long leg of one bracket with fasteners that engage threaded bores in the chassis so that the short leg of the one bracket extends laterally outward away from the chassis. One of skill in the art will appreciate that attaching the short leg and the long leg to the chassis can be done in either order.

Step 1320—Align a set of at least one short-leg-rack-mount-openings in one bracket over a set of at least one bore in the mounting flange on one side of the rack opening.

Step 1330—Use a threaded engagement to have a set of at least one fastener hold the bracket against the mounting flange by engaging a second portion of the perimeter of each of the short-leg-rack-mount-openings. The second portion of the perimeter differing from the first portion of the perimeter.

Step 1340—Align a set of at least one long-leg-rack-mount-openings in one bracket over a set of at least one bore in the mounting flange on one side of the rack opening.

Step 1350—Use a threaded engagement to have a set of at least one fastener hold the bracket against the mounting flange by engaging a second portion of the perimeter of each of the long-leg-rack-mount-openings. The second portion of the perimeter differing from the first portion of the perimeter. One of skill in the art will appreciate that affixing the long-leg and the short-leg to the two mounting flanges can be done in either order. Fasteners may be applied to both mounting flanges through openings in both the long leg and the short leg before attaching two or more fasteners to one mounting flange to complete fastening either leg if the brackets use multiple fasteners.

Step 1355—End.

Specialized Brackets.

The example set forth above had a pair of interchangeable brackets 100. An alternative would be a pair of specialized brackets 320 and 324 which may be used in the three standardized racks using a pair of specialized brackets 320 and 324. A difference being that one specialized bracket must be used to provide the short leg 108 for connecting to the mounting flange of the intermediate-width rack and the other specialized bracket must be used to provide the long leg 112 for connecting to the mounting flange for the intermediate width rack.

FIG. 15 shows the short leg 108 of specialized bracket 320. FIG. 16 shows the long leg 112 of the specialized bracket 320. The elements shown for specialized bracket 320 are identical to FIG. 2 and FIG. 3 for interchangeable bracket 100 with the exception that the short-leg-flange-mount-openings 130 and 134 have been replaced by short-leg-bores 330 and 334. These short-leg-bores are positioned to work with the narrow-gap frame (compare with FIG. 5) but the bore 330 and bore 334 are not adapted to work with the openings on the intermediate-gap frame (FIG. 6). The specialized bracket 320 may be used with an intermediate-gap frame but the short leg 108 must be connected to the chassis 204 so that the long leg is positioned to engage with the flange mounts of the intermediate-gap frame as shown in FIG. 6.

FIG. 17 shows the short leg 108 of specialized bracket 324. FIG. 18 shows the long leg 112 of specialized bracket 324. The elements shown for specialized bracket 324 are the same as shown for interchangeable bracket 100 in FIG. 2 and FIG. 3 with the exception that the long-leg-flange-mount-openings 140 and 144 have been replaced by long-leg-bores 340 and 344. Specialized bracket 324 may be used with the wide-gap frame as shown in FIG. 4 as long-leg-bores 340 and 344 are appropriately positioned for that use. However, the long-leg-bores 340 and 344 are not adapted for use in the intermediate-gap frame as shown in FIG. 6. This is not a problem as specialized bracket 324 may be positioned so that the long leg 112 of specialized bracket 324 engages the chassis 204 leaving the short leg 108 of specialized bracket 324 to engage with the flange mount of the intermediate-gap frame. The short-leg-rack-mount-openings 130 and 134 of specialized bracket 324 are adapted for use with either the narrow-gap frame or the intermediate gap frame (see FIG. 5 and FIG. 6).

One of skill in the art will appreciate that having a pair of interchangeable brackets 100 may be preferred over maintaining inventories of specialized brackets 320 and 324.

Optional Wall Mount.

In addition to the option to use one pair of brackets 100 to engage with three different standardized racks (wide-gap rack, narrow-gap rack, and intermediate-gap rack), the brackets 100 may be adopted to allow the chassis 204 to be mounted to a wall rather than to a standardized rack. FIG. 2 shows an opening 304 on the short leg 108 of the bracket 100. As illustrated in FIG. 2, opening 304 may be larger than short-leg-chassis-holes 116 as wood screws to support the weight of the chassis 204 may have a larger major diameter than machine screws to affix the chassis to a threaded bore or cap nut.

FIG. 3 shows that the long-leg 112 has a set of wall-mount-chassis-holes 308. Fasteners may be used to affix the long leg 112 of the bracket 100 to the chassis 204 to place the short leg 108 extending laterally outward from the rear of the chassis. The placement of the threaded bores in the chassis 204 may be closer to the back of the chassis than the length of the long leg 112 to provide an air gap between a chassis 204 mounted to a wall and the wall.

Those of skill in the art will appreciate that the orientation of the component when mounted to the wall may be different than the orientation of the component when inserted into a standardized rack. For example, the component may be rotated 90 degrees so that the two longest dimensions of the component are in a vertical orientation parallel with the wall and slightly offset from the wall.

Figure 19:
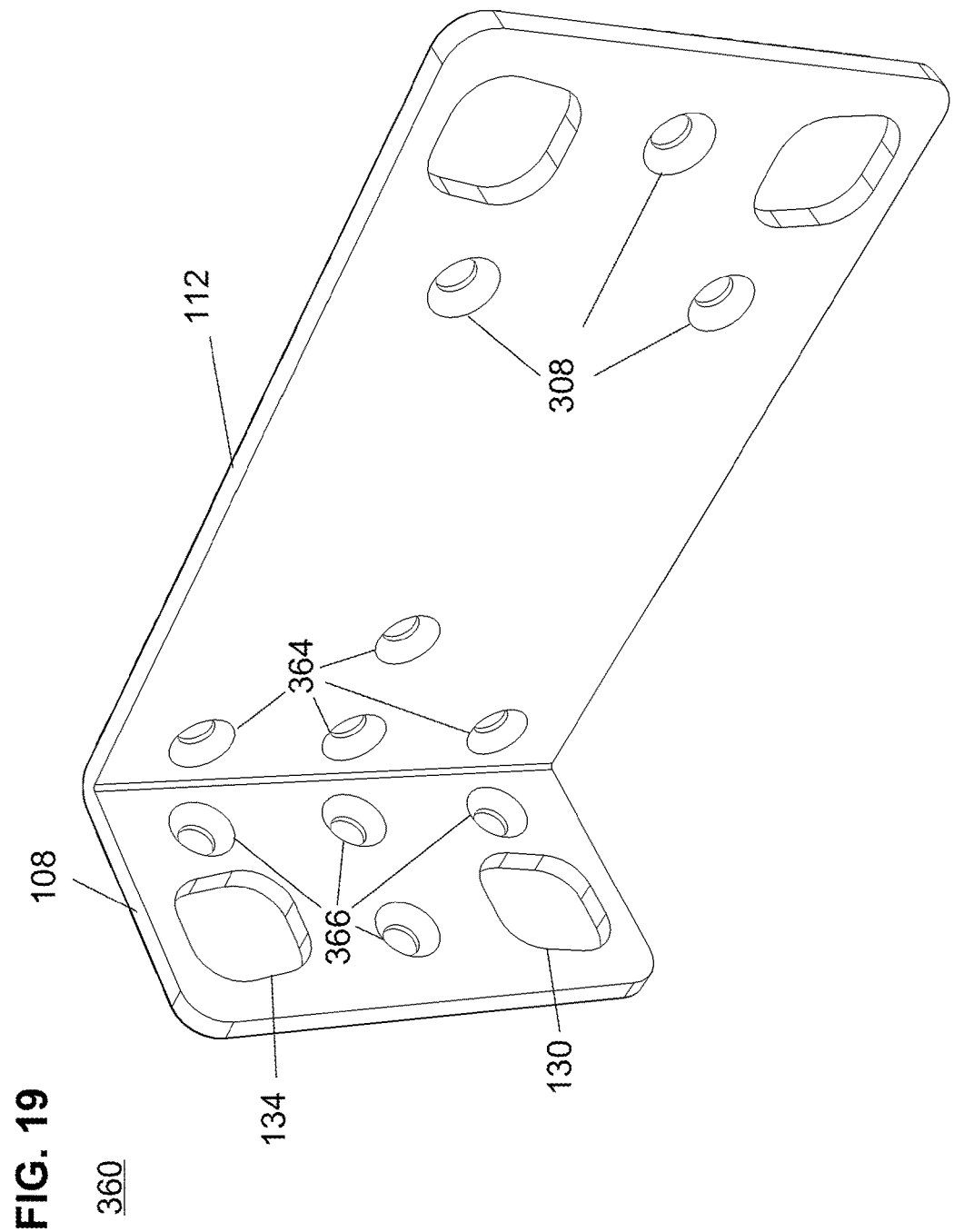
FIG. 19 is a front perspective view of alternative bracket.

FIG. 19 shows a front perspective view of alternative bracket 360 which differs from bracket 100 which included a set of three short-leg-chassis-holes 116, and a set of three long-leg-chassis-holes 124. In contrast, the bracket 360 in FIG. 19 a set of four short-leg-chassis-holes 366, and a set of four long-leg-chassis-holes 364. Having a fourth short-leg-chassis hole 366 provides greater strength when a bracket is supporting a heavy component. One or more fasteners to affix the short leg 108 to the wall may use one or both of the pair of short-leg-rack-mount-openings 130 and 134.

Materials.

The bracket 100 may be made from a number of different materials as long as the bracket 100 is able to hold the chassis 204 reliably to the mounting flanges. The teachings of the present disclosure are not limited to the use of a specific material as a variety of metals, polymers, or other materials may be used. The particular material used and bracket dimensions will be a function of the weight of the component to be supported, the number of brackets used to support the component, and other conventional considerations. For one component, the material may be cold rolled steel with a nominal thickness of 0.076 inches.

ALTERNATIVES AND VARIATIONS

Shape of Rack-Mount-Openings.

The short-leg-rack-mount-openings 130 and 134 and the long-leg-rack-mount-openings 140 and 144 may be trapezoids with rounded corners as shown in FIG. 2 and FIG. 3. Those of skill in the art will recognize that other shapes may be used such as an oval shape, a polygon, a polygon with rounded corners, or some other shape. The only constraints are that the mounting flange bores for the two standardized racks to use that rack-mount-opening must be exposed when the bracket is positioned appropriately and there is adequate perimeter of the rack-mount-openings to be retained by the head of the intended fasteners for the two mounting flange bores.

However, the trapezoid shape disclosed above is desirable. For each fastener to be used there is a major diameter of the threaded portion of the fastener. The opening through the bracket must be a bit bigger than the major diameter. Manufacturing tolerances for the alignment of bore holes in the mounting flanges tend to have more tolerance in the horizontal direction than in the vertical direction. Thus the opening in a bracket to address one type of frame would tend to be approximately the size of the major diameter for the fastener plus a vertical tolerance plus a larger horizontal tolerance. This opening would look like an oval with the long axis on the horizontal axis. To use the bracket with a second frame with different flange mount spacings, one would need another horizontal oval with a slightly different target for the bore axis and a vertical tolerance and a larger horizontal tolerance. The result of having two different sets of bore position targets and tolerances yields a set of partially overlapping horizontal ovals which can be captured within an appropriately sized trapezoid.

One of skill in the art will recognize that some of the alternative implementations set forth above are not universally mutually exclusive and that in some cases additional implementations can be created that employ aspects of two or more of the variations described above. Likewise, the present disclosure is not limited to the specific examples or particular embodiments provided to promote understanding of the various teachings of the present disclosure. Moreover, the scope of the claims which follow covers the range of variations, modifications, and substitutes for the components described herein as would be known to those of skill in the art.

The legal limitations of the scope of the claimed invention are set forth in the claims that follow and extend to cover their legal equivalents. Those unfamiliar with the legal tests for equivalency should consult a person registered to practice before the patent authority which granted this patent such as the United States Patent and Trademark Office or its counterpart.

What is claimed is:

1. An assembly comprising:
   a component with a pattern of bores for receipt of threaded chassis connectors to connect a pair of mounting brackets to the component, the component having a specific component width;
   an ETSI EN 300 119 rack adapted to receive multiple components through engagement of a set of threaded elements with a set of bores within the ETSI EN 300 119 rack;
   a pair of brackets with a first bracket and a second bracket adapted to attach the component with the specific component width to at least three different standardized types of racks including the ETSI EN 300 119 rack;
   the first bracket and the second bracket each comprising:
   a corner connecting a short leg with a long leg that is longer than the short leg;
   the short leg having a set of at least one short-leg-chassis-holes to allow a set of at least one threaded chassis connector to connect with a pattern of threaded bores on the component to allow each bracket to be connected to the component with the long leg extending away from the component;
   the long leg having a set of at least two long-leg-rack-mount-openings;
   the long leg having a set of at least one long-leg-chassis-holes to allow a set of at least one threaded chassis connector to connect with the pattern of threaded bores on the component to allow each bracket to be connected to the component with the short leg extending away from the component;
   the short leg having a set of at least two short-leg-rack-mount-openings;
   the pair of brackets are connected by threaded chassis connectors to the component and connected by the set of threaded elements to the ETSI EN 300-119 rack:
   with the short leg of the first bracket connected to the component and the long leg of the first bracket extending outward from the component and the long leg of the first bracket is connected to the ETSI EN 300 119 rack; and
   with the long leg of a second bracket connected to the component and the short leg of the second bracket extending outward from the component and the short leg of the second bracket connected to the ETSI EN 300 119 rack;
   wherein the pair of brackets may be used to connect the component to a North American Telco 23 Inch Rack when the pair of brackets is connected to the component and the long legs of both of the pair of brackets engage the North American Telco 23 Inch Rack; and
   wherein the pair of brackets may be used to connect the component to a EIA-310 19 Inch Rack when the pair of brackets is connected to the component and the short legs of both of the pair of brackets engage the EIA-310 19 Inch Rack; and
   wherein the component may be connected to the pair of brackets with the pattern of bores in the component for the North American Telco 23 Inch Rack, EIA-310 19 Inch Rack and the ETSI EN 300-119 rack.

2. The assembly of claim 1 wherein the first bracket is connected to a right side of the component.

3. The assembly of claim 1 wherein the first bracket is connected to a left side of the component.

4. The assembly of claim 1 wherein the first bracket and the second bracket are sufficiently interchangeable so that first bracket may replace the second bracket and the second bracket may replace the first bracket so that
   the pair of brackets are connected by threaded chassis connectors to the component and connected by the set of threaded elements to the ETSI EN 300 119 rack:
   with the long leg of the first bracket connected to the component and the short leg of the first bracket extending outward from the component and the short leg of the first bracket is connected to the ETSI EN 300 119 rack; and
   with the short leg of a second bracket connected to the component and the long leg of the second bracket extending outward from the component and the long leg of the second bracket connected to the ETSI EN 300 119 rack.

5. The assembly of claim 1 wherein the first bracket and the second bracket are specialized and not sufficiently interchangeable to allow the first bracket to replace the second bracket and the second bracket to replace the first bracket so that
   whenever the pair of brackets are connected by threaded chassis connectors to the component and connected by the set of threaded elements to the ETSI EN 300 119 rack:
   it is the short leg of the first bracket connected to the component and the long leg of the first bracket extending outward from the component and the long leg of the first bracket and connected to the ETSI EN 300 119 rack; and it is the long leg of a second bracket connected to the component and the short leg of the second bracket extending outward from the component and the short leg of the second bracket connected to the ETSI EN 300 119 rack.

6. The assembly of claim 1 wherein the component is connected to the ETSI EN 300 119 rack through long-leg-rack-mount-openings and short-leg-rack-mount-openings that are trapezoids with rounded corners.

7. The assembly of claim 1 wherein the first bracket and the second bracket each have a second set of long-leg-chassis-holes on the long leg and at least one wall fastener opening on the short leg so that the long legs may be attached to the component to provide an air gap between a back of the component and a wall engaged with the short legs of the pair of brackets.

8. The assembly of claim 1 wherein the first bracket and the second bracket each have a second set of long-leg-chassis-holes on the long leg so that the long legs may be attached to the component to provide an air gap between a back of the component and a wall engaged with the short legs of the pair of brackets though use of at least one short-leg-chassis-hole.

9. The assembly of claim 1 wherein each of the pair of brackets are engaged with a pair of mounting flanges on the ETSI EN 300 119 rack by threaded connectors that pass through unthreaded bores in the pair of mounting flanges and are engaged by cage nuts.

10. The assembly of claim 1 wherein each of the pair of brackets are engaged with a pair of mounting flanges on the ETSI EN 300 119 rack by threaded connectors that engage threaded bores in the pair of mounting flanges.

* * * * *